United States Patent
Masaki

(10) Patent No.: US 8,699,229 B2
(45) Date of Patent: Apr. 15, 2014

(54) DISPLAY AND ELECTRONIC UNIT

(75) Inventor: Koji Masaki, Tokyo (JP)

(73) Assignee: Sony Corporation (JP)

( * ) Notice: Subject to any disclaimer, the term of this patent is extended or adjusted under 35 U.S.C. 154(b) by 233 days.

(21) Appl. No.: 13/346,928

(22) Filed: Jan. 10, 2012

(65) Prior Publication Data

US 2012/0188724 A1 Jul. 26, 2012

(30) Foreign Application Priority Data

Jan. 21, 2011 (JP) ................. P2011-010407

(51) Int. Cl.
*H05K 7/20* (2006.01)
*H05K 7/00* (2006.01)

(52) U.S. Cl.
USPC ........... 361/720; 361/752; 361/753; 361/759; 361/801; 361/807

(58) Field of Classification Search
USPC ............. 361/679.01, 679.02, 679.21, 679.22, 361/679.46, 679.54, 720, 736, 737, 361/740–742, 752, 757, 758, 801–803, 361/807–809, 825; 165/80.2, 80.3, 104.33, 165/185; 324/765; 349/56–60, 187; 411/508–511, 518, 520, 908, 913; 24/453, 457, 458, 297, 508; 211/26, 211/41.17; 29/825, 831; 312/223.1, 223.2, 312/223.6
See application file for complete search history.

(56) References Cited

U.S. PATENT DOCUMENTS

| | | | | |
|---|---|---|---|---|
| 5,398,156 A | * | 3/1995 | Steffes et al. | 361/679.58 |
| 5,796,593 A | * | 8/1998 | Mills et al. | 361/801 |
| 6,424,538 B1 | * | 7/2002 | Paquin | 361/752 |
| 6,746,254 B2 | * | 6/2004 | Hooper | 439/95 |
| 6,785,146 B2 | * | 8/2004 | Koike et al. | 361/759 |
| 6,809,933 B2 | * | 10/2004 | Kuchiishi et al. | 361/752 |
| 6,864,433 B1 | * | 3/2005 | Fetzer et al. | 174/138 G |
| 2005/0243526 A1 | * | 11/2005 | Park et al. | 361/753 |
| 2006/0139889 A1 | * | 6/2006 | Lin et al. | 361/715 |
| 2007/0152697 A1 | * | 7/2007 | Hsu | 324/765 |

FOREIGN PATENT DOCUMENTS

JP 2009-295738 A 12/2009

* cited by examiner

*Primary Examiner* — Michail V Datskovskiy
(74) *Attorney, Agent, or Firm* — Lerner, David, Littenberg, Krumholz & Mentlik, LLP

(57) ABSTRACT

A display capable of inhibiting deformation of a component during transport or the like and an electronic unit including the display are provided. A display includes: a main section; and a board-mounting plate disposed on one surface of the main section, and having a board-mounting region on a main surface on a side opposite to a side facing the main section, in which the board-mounting plate includes, at corners at both ends of a side of the mounting region, hook sections allowing corners of a board to be hooked thereto, and the hook sections each are fixed to the main surface on two sides of the corner of the mounting region.

9 Claims, 13 Drawing Sheets

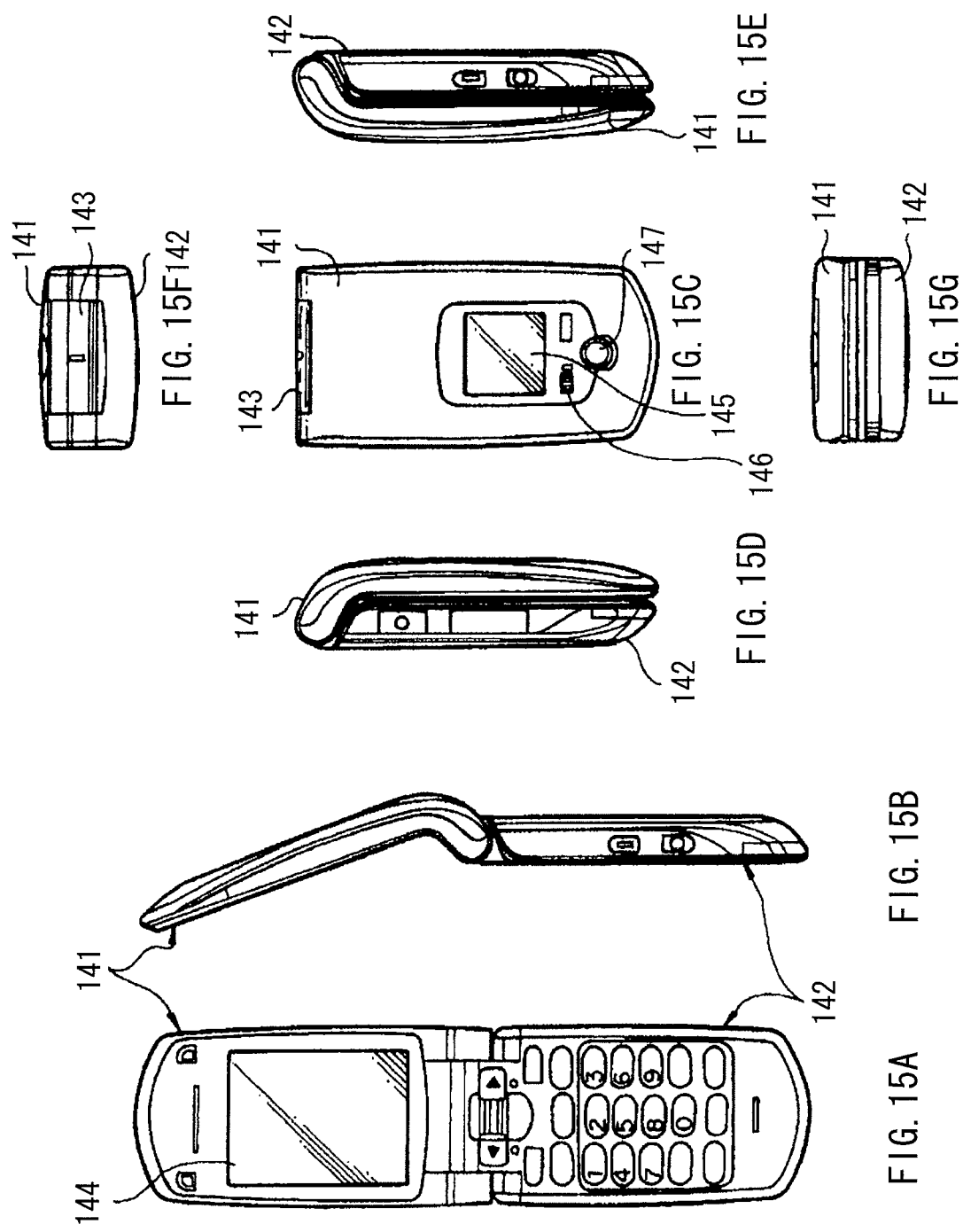

DISPLAY AND ELECTRONIC UNIT

CROSS-REFERENCE TO RELATED APPLICATION

The present application claims priority from Japanese Patent Application No. JP 2011-010407 filed in the Japanese Patent Office on Jan. 21, 2011, the entire content of which is incorporated herein by reference.

BACKGROUND

The present technology relates to a display such as a television, and an electronic unit.

A board including a drive circuit is mounted in a display such as a television or an electronic unit. In related art, such a board is fixed by tightening screws at four corners or more, and the cost of screws and working time for tightening screws are necessary. For example, in Japanese Unexamined Patent Application Publication No. 2009-295738, while a mountain-shaped projection is provided in a downward direction on an L-shaped bracket, a metal through-hole is provided at a corner of a board, and the mountain-shaped projection is inserted into the metal through-hole to fix the board without screws.

SUMMARY

However, in Japanese Unexamined Patent Application Publication No. 2009-295738, the strength of the L-shaped bracket is not sufficient, and the L-shaped bracket may be easily deformed and defective during transport or the like.

It is desirable to provide a display capable of inhibiting deformation of a component during transport or the like, and an electronic unit including the display.

According to an embodiment of the technology, there is provided a display including: a main section; and a board-mounting plate disposed on one surface of the main section, and having a board-mounting region on a main surface on a side opposite to a side facing the main section, in which the board-mounting plate includes, at corners at both ends of a side of the mounting region, hook sections allowing corners of a board to be hooked thereto, and the hook sections each are fixed to the main surface on two sides of the corner of the mounting region.

According to an embodiment of the technology, there is provided an electronic unit including: a main section; and a board-mounting plate disposed on one surface of the main section, and having a board-mounting region on a main surface on a side opposite to a side facing the main section, in which the board-mounting plate includes, at corners at both ends of a side of the mounting region, hook sections allowing corners of a board to be hooked thereto, and the hook sections each are fixed to the main surface on two sides of the corner of the mounting region.

In the display according to the embodiment of the technology, or the electronic unit according to the embodiment of the technology, while the board is inclined with respect to the main surface, the corners at both ends of a side of the board are slid into the hook sections. Next, the board is rotated around ends of the hook sections as rotation axes toward the main surface. Thus, the corners of a board are hooked to the hook sections, and the board is positioned in the mounting region.

In the display according to the embodiment of the technology, or the electronic unit according to the embodiment of the technology, the hook sections allowing the corners of a board to be hooked thereto are disposed at corners at both ends of a side of the mounting region, and the hook sections are fixed to the main surface on two sides of the corner of the mounting region; therefore, the strength of the hook sections is enhanced, and deformation of the hook sections during transport or the like is allowed to be inhibited.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 15A to 15G illustrate Application Example 4, where FIGS. 15A and 15B are a front view and a side view in a state in which Application Example 4 is opened, respectively, and FIGS. 15C, 15D, 15E, 15F and 15G are a front view, a left side view, a right side view, a top view, and a bottom view in a state in which Application Example 4 is closed, respectively.

DETAILED DESCRIPTION OF THE PREFERRED EMBODIMENTS

A preferred embodiment of the technology will be described in detail below referring to the accompanying drawings.

Figure 1:
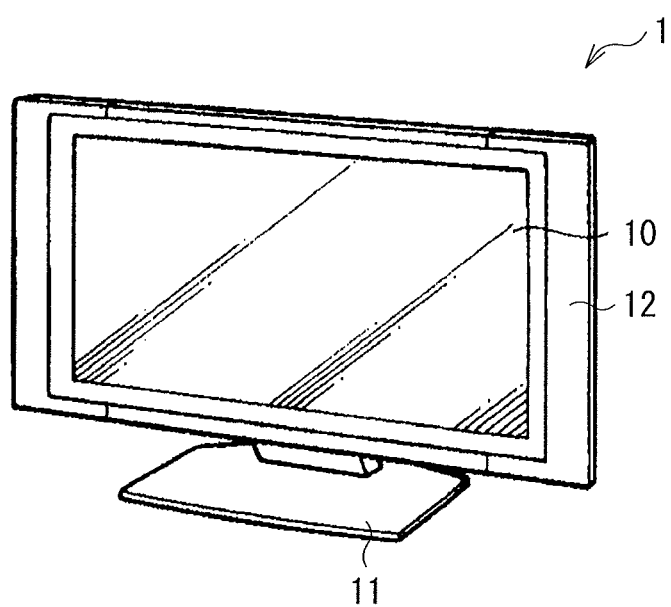
FIG. 1 is a perspective view illustrating an appearance of a display according to an embodiment of the technology.
Figure 2:
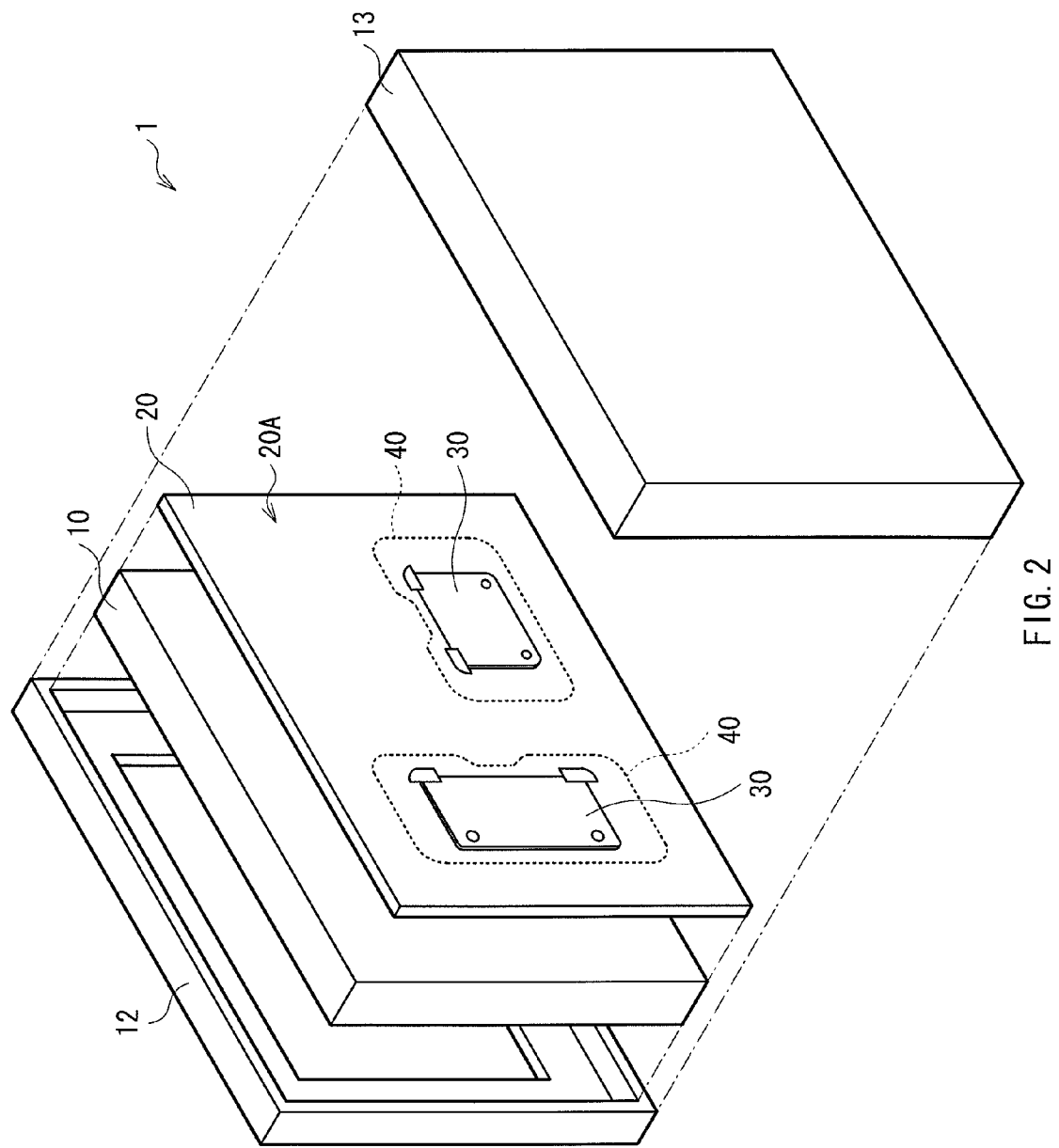
FIG. 2 is an exploded perspective view of the display illustrated in FIG. 1.

FIG. 1 illustrates an appearance of a display (a television) according to an embodiment of the technology, and FIG. 2 illustrates an exploded view of the display. A display 1 has, for example, a configuration in which a display section 10 is supported by a stand 11. A frame-shaped exterior member (a so-called bezel) is disposed on a front surface of the display section 10. A board-mounting plate 20 for mounting a board 30 with a drive circuit is disposed on a rear surface of the display section 10. The whole rear surface of the display section 10 and the whole board-mounting plate 20 are covered with a rear cover 13. It is to be noted that the display section 10 corresponds to a specific example of "a main section" in the technology.

The display section 10 includes, for example, a backlight unit (not illustrated) on a rear surface of a liquid crystal panel (not illustrated).

The board-mounting plate 20 is configured of, for example, a metal plate made of aluminum (Al), iron (Fe), or the like. It is to be noted that the board-mounting plate 20 may be provided separately from the display section 10, or may also serve as an enclosure (a so-called back chassis) of the backlight unit (not illustrated) of the display section 10.

A mounting region 40 for the board 30 is disposed in a main surface 20A, on a side opposite to a side facing the display section 10, of the board-mounting plate 20. The mounting region 40 is appropriately provided according to the number of boards 30 mounted on the board-mounting plate 20, the dimensions and shape of each board 30.

Figure 3:
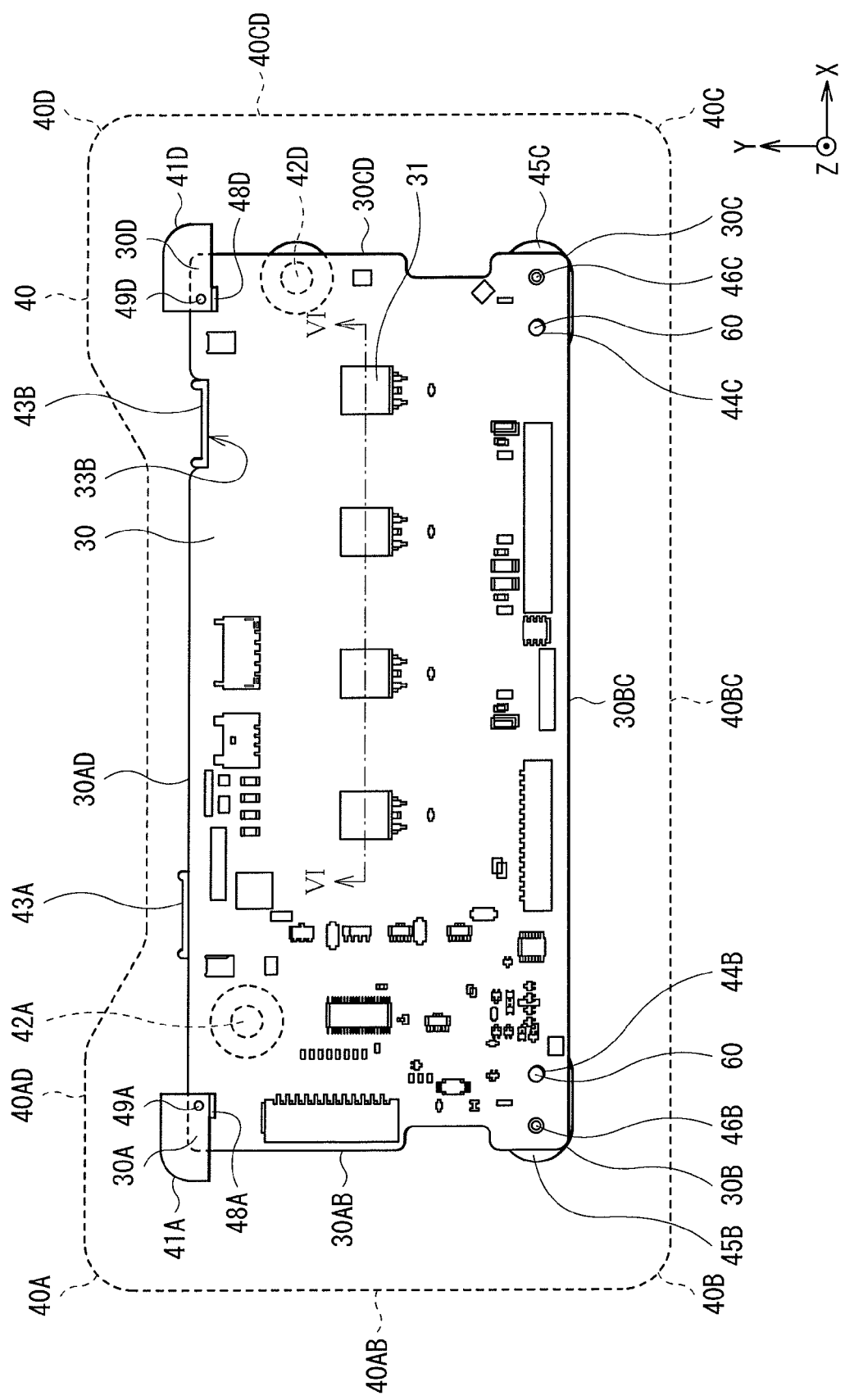
FIG. 3 is an enlarged plan view of one mounting region illustrated in FIG. 2.
Figure 4:
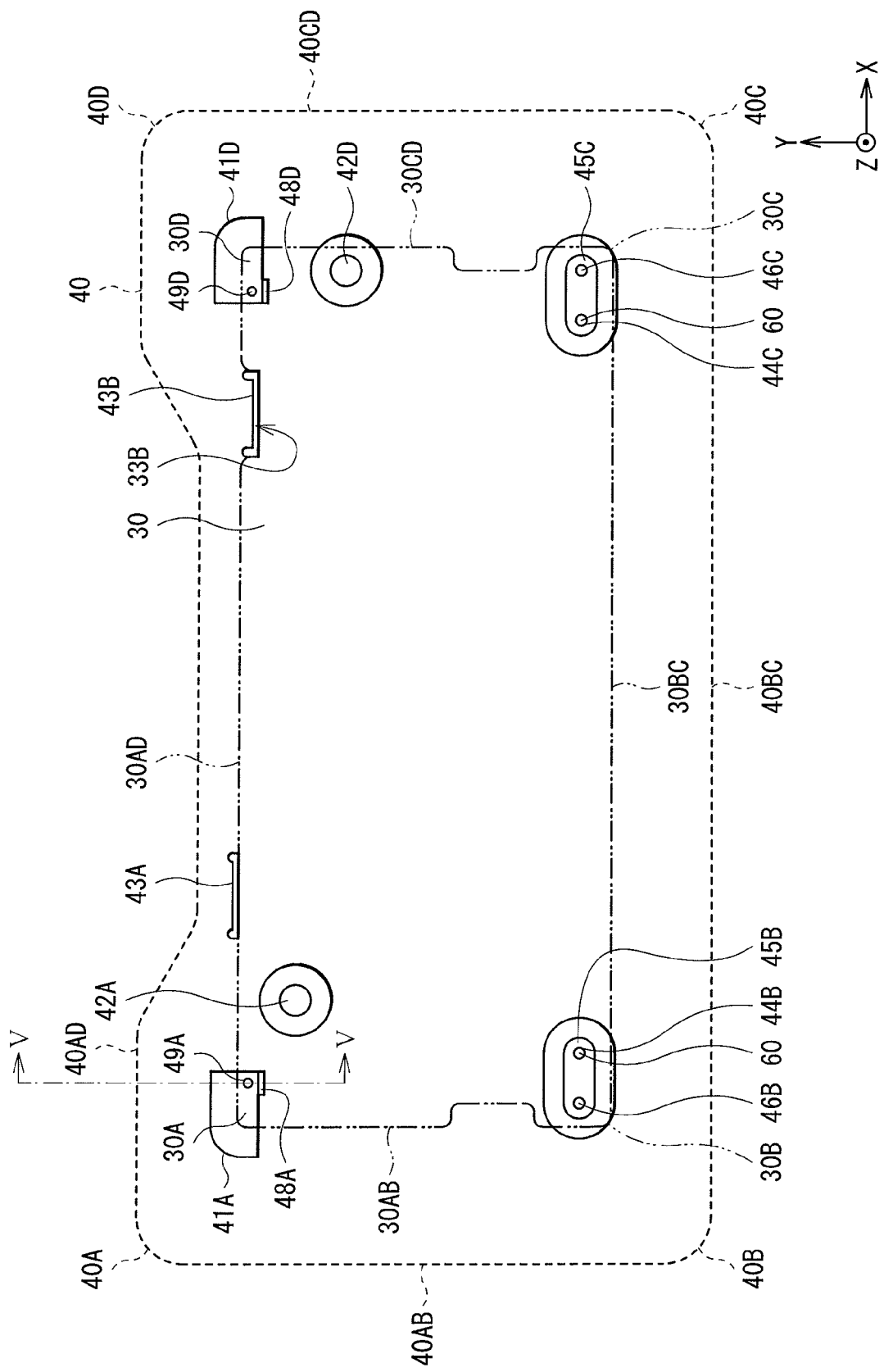
FIG. 4 is a plan view illustrating a state where a board is removed from the mounting region illustrated in FIG. 3.

FIG. 3 illustrates an enlarged view of one mounting region 40 illustrated in FIG. 2. FIG. 4 illustrates a state where the board 30 is removed from the mounting region 40 illustrated in FIG. 3. It is to be noted that in FIGS. 3 to 11, and later drawings, a horizontal direction, a vertical direction, and a direction orthogonal to the main surface 20A (a height direction) are represented by x, y, and z, respectively.

The board 30 is configured of, for example, a printed circuit board, and has a horizontally-oriented rectangular shape with four corners 30A, 30B, 30C, and 30D, and four sides 30AB, 30BC, 30CD, and 30AD. A chip 31 is mounted on the board 30.

The mounting region 40 has a horizontally-oriented rectangular shape with four corners 40A, 40B, 40C, and 40D and four sides 40AB, 40BC, 40CD, and 40AD. It is to be noted that to reduce differences in surface height in the case where the board 30 is mounted on the mounting region 40, the mounting region 40 is a recessed section which is lower in height than a peripheral region of the main surface 20A.

Hook sections 41A and 41D are disposed at both of the corners 40A and 40D on the side 40AD of the mounting region 40. Base sections 42A and 42D are disposed in proximity to the hook sections 41A and 41D, respectively. A first upstanding section 43A and a second upstanding section 43B are disposed between the hook sections 41A and 41D on the side 40AD. On the other hand, screw holes 44B and 44C are disposed on the side 40BC facing the side 40AD. It is to be noted that to prevent deformation during transport, differences in surface height between the hook sections 41A and 41D, the first upstanding section 43A and the second upstanding section 43B, and four surrounding sides 40AB, 40BC, 40CD, and 40AD are preferably as small as possible.

The hook sections 41A and 41D allow the corners 30A and 30D of the board 30 to be hooked thereto, and are rectangular bump sections formed by embossing on the board-mounting plate 20. The hook section 41A is fixed to the main surface 20A on two sides 40AB and 40AD of the corner 40A of the mounting region 40. The hook section 41D is fixed to the main surface 20A on two sides 40AD and 40CD of the corner 40D of the mounting region 40. Therefore, in the display, deformation of the hook sections 41A and 41D during transport or the like is allowed to be inhibited.

The hook sections 41A and 41D are preferably provided on the long side 40AD of the mounting region 40, because when the board 30 is mounted, rotation on an xy plane of the board 30 is allowed to be inhibited.

The base sections 42A and 42D abut against rear surfaces of the corners 30A and 30D of the board 30, respectively, and confine a z-direction position of the board 30 with the hook sections 41A and 41D. The base sections 42A and 42D are truncated-cone-shaped bump sections formed by embossing on the board-mounting plate 20.

The first upstanding section 43A and the second upstanding section 43B confine a y-direction position of the board 30, and controls rotation on the xy plane of the board 30, and are disposed on a side with the hook sections 41A and 41D disposed thereon of the mounting region 40, and are orthogonal to the main surface 20A, and abut against a side surface on the side 30AD of the board 30. The first upstanding section 43A and the second upstanding section 43B are formed by a cutting-bending process on the board-mounting plate 20.

The second upstanding section 43B is disposed on a more inner side than the first upstanding section 43A. In other words, the second upstanding section 43B is disposed in a position shifted from the first upstanding section 43A in a direction toward the side 40BC facing the side 40AD with the hook sections 41A and 41D disposed thereon of the mounting region 40. On the other hand, the board 30 includes, on the side 30AD, a notch 33B allowing the second upstanding section 43B to be inserted thereinto. Therefore, an x-direction position of the board 30 is allowed to be confined.

The screw holes 44B and 44C fix the corners 30B and 30C of the board 30 by screws 60, and are disposed on the side 40BC facing the side 40AD with the hook sections 41A and 41D disposed thereon of the mounting region 40. The screw holes 44B and 44C are preferably disposed on top surfaces of bump sections 45B and 45C disposed at the corners 40B and 40C of the mounting region 40, respectively, to prevent the screws 60 from causing damage to the display section 10. The bump sections 45B and 45C are formed by embossing on the board-mounting plate 20. Dowels 46B and 46C for positioning of the board 30 may be disposed on the top surfaces of the bump sections 45B and 45C.

Figure 5:
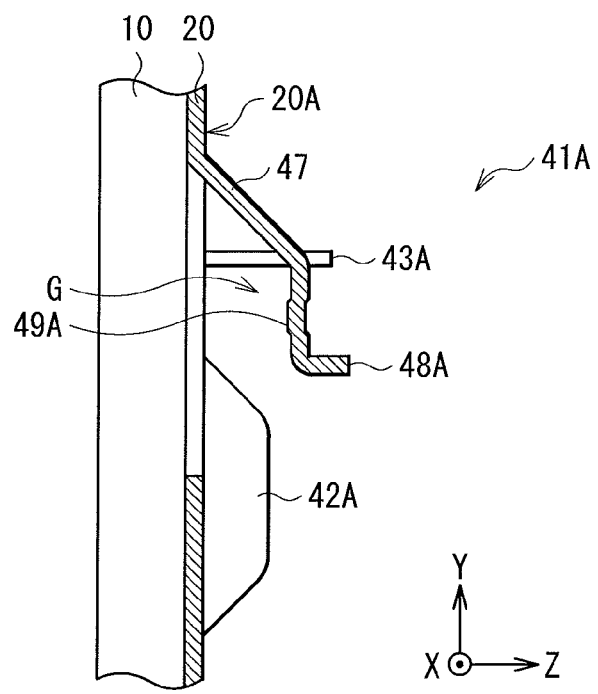
FIG. 5 is a sectional view illustrating a configuration of a hook section in FIG. 3.

FIG. 5 illustrates a sectional configuration of the hook section 41A. Two sides 40AB and 40AD of the hook section 41A are closed by a side wall section 47 fixed to the main surface 20A as described above. Thus, the hook section 41A is fixed to the main surface 20A on the two sides 40AB and 40AD; therefore, compared to an L-shaped bracket in related art, mechanical strength is enhanced, and defective components caused by deformation during transport or the like are reduced. On the other hand, the other two sides of the hook section 41A are open ends, and the corner 30A of the board 30 is allowed to be contained in a gap G between the hook section 41A and the main surface 20A. It is to be noted that the hook section 41D has the same configuration as that of the hook section 41A.

A guide projection 48A projected toward a side opposite to the main surface 20A is disposed at an end of the hook section 41A. When the guide projection 48A is provided, the corner 30A of the board 30 is allowed to be guided to the hook section 41A, and workability is allowed to be improved. It is to be noted that as in the case of the hook section 41A, a guide projection 48D (not illustrated) is disposed at an end of the hook section 41D.

Moreover, the hook section 41A includes a projected section 49A on a surface facing the main surface 20A, and the projected section 49A abuts against a surface of the corner 30A of the board 30. A recessed section 39A (not illustrated in FIG. 5, refer to FIG. 11) allowing the projected section 49A to be inserted thereinto is disposed on the surface of the corner 30A of the board 30. Therefore, positioning of the board 30 is performed more easily. It is to be noted that as in the case of the hook section 41A, the hook section 41D includes a projected section 49D (not illustrated).

Figure 6:
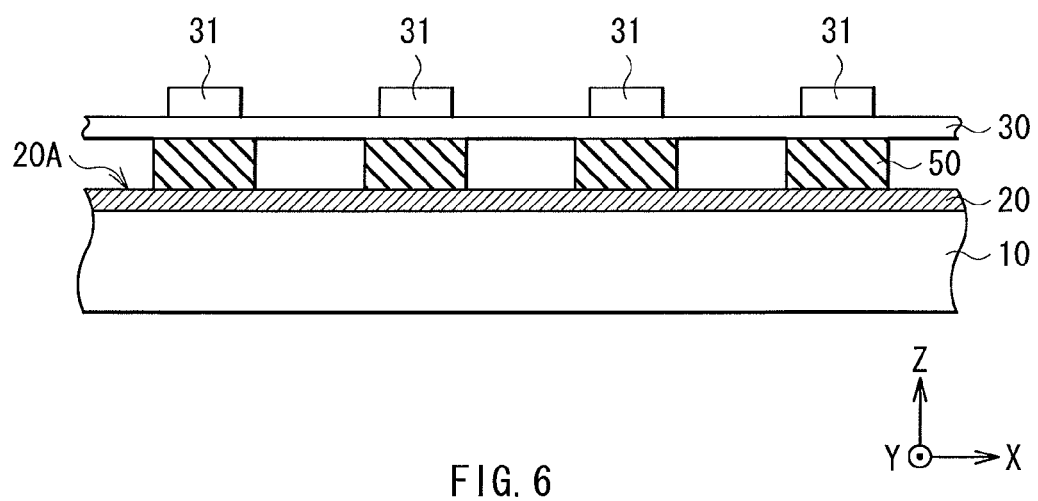
FIG. 6 is a sectional view illustrating a configuration taken along a line VI-VI of FIG. 3.

FIG. 6 illustrates a sectional configuration taken along a line VI-VI of FIG. 3. A heat dissipation pad (thermal pad) 50 is disposed between the main surface 20A of the board-mounting plate 20 and the rear surface of the board 30. The heat dissipation pad 50 is disposed directly below the chip 31 mounted on the board 30, and releases heat generated in the chip 31 to the board-mounting plate 20. The heat dissipation pad 50 is made of a material with electrical insulation and high thermal conductivity, for example, a urethane-based material. It is to be noted that instead of the heat dissipation pad 50, a heat dissipation sheet may be provided.

Figure 7:
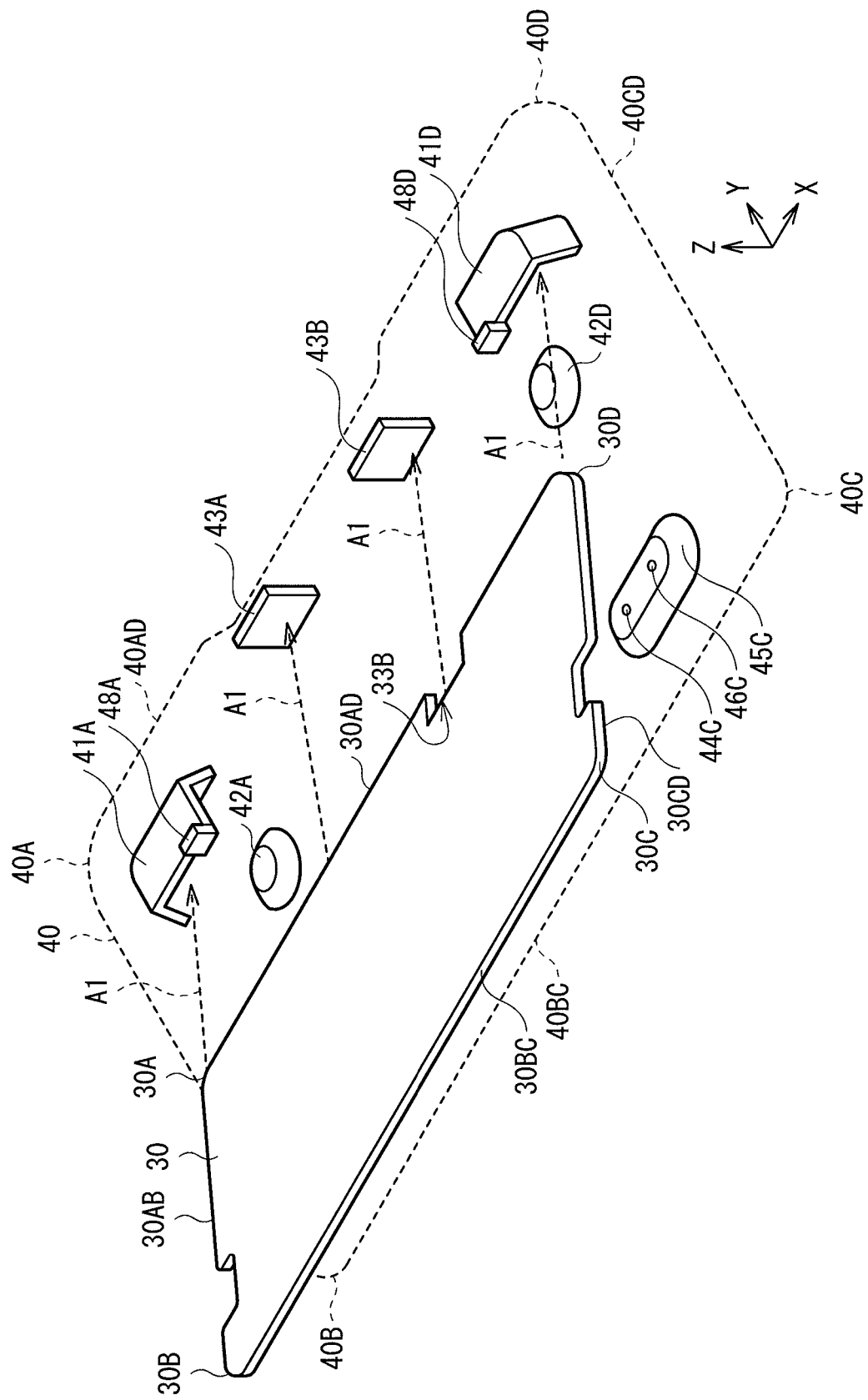
FIG. 7 is a perspective view illustrating a method of mounting a board on the mounting region illustrated in FIG. 2 in order of steps.

FIGS. 7 to 11 illustrate steps of mounting the board 30 onto such a mounting region 40 in order. First, as illustrated in FIG. 7, the board 30 is held above the mounting region 40 while being inclined with respect to the main surface 20A, and as indicated by an arrow A1, the corners 30A and 30D of the board 30 are slid into the hook sections 41A and 41D, respectively, from obliquely above.

Figure 8:
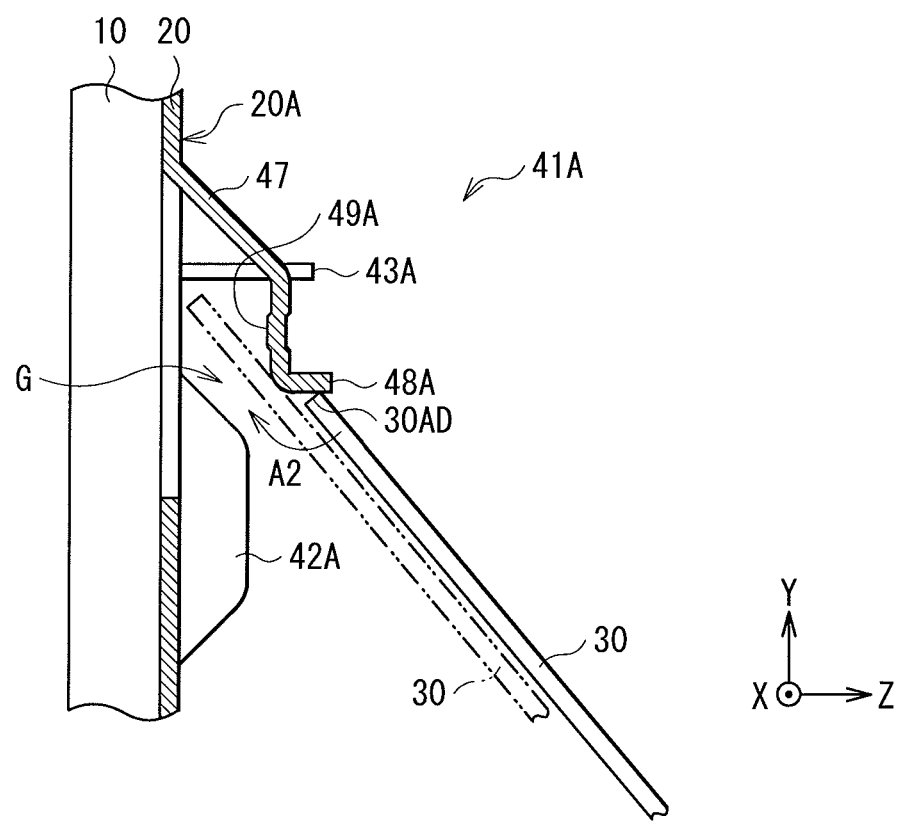
FIG. 8 is a sectional view for describing a function of a guide projection illustrated in FIG. 5.

At this time, as illustrated in FIG. 8, first, when the side 30AD of the board 30 abuts against the guide projection 48A at the end of the hook section 41A, as indicated by an arrow A2, the corner 30A of the board 30 is allowed to be easily slid into the hook section 41A. It is to be noted that although not illustrated, the same applies to the case of the hook section 41D.

Figure 9:
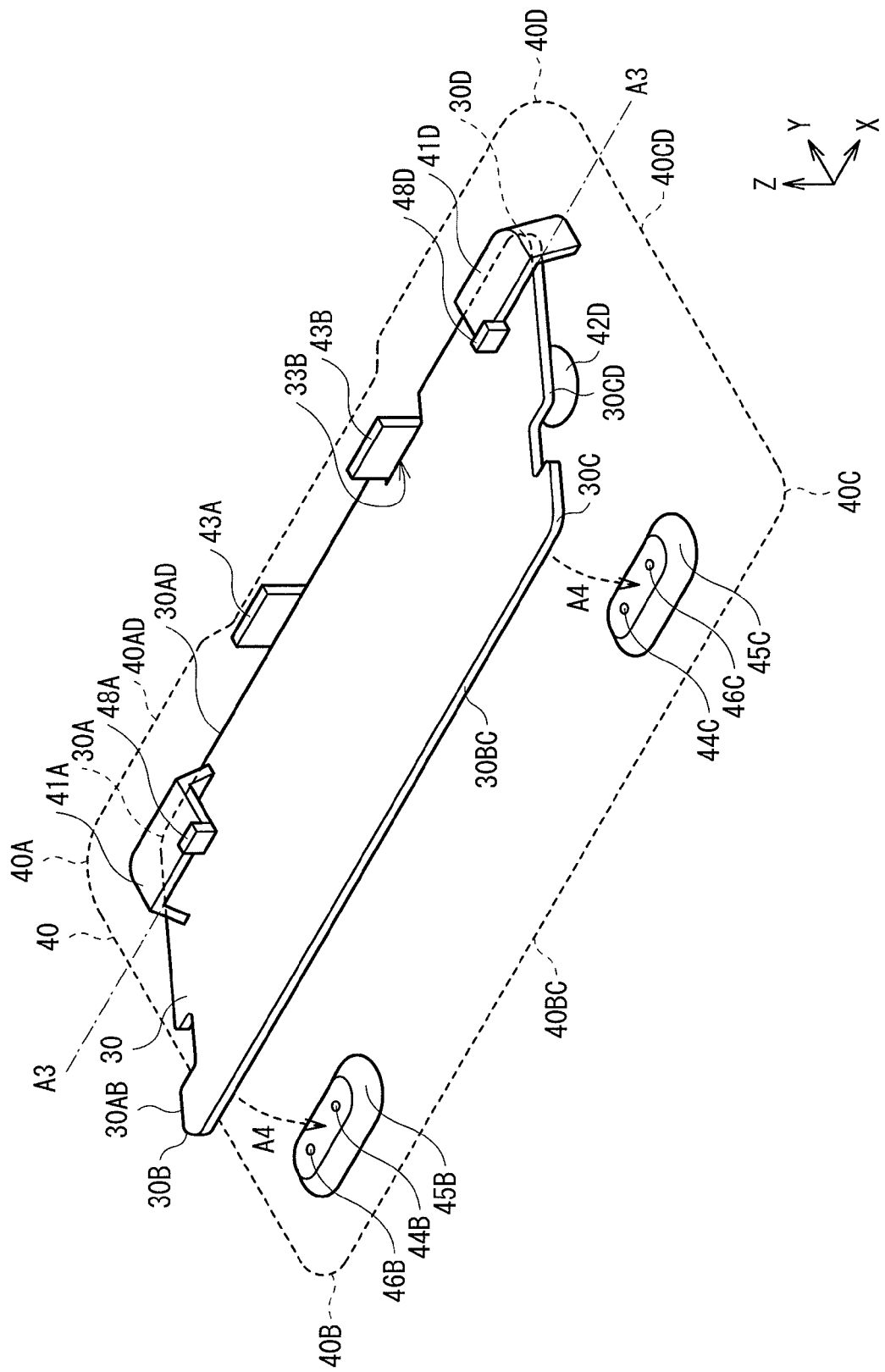
FIG. 9 is a perspective view illustrating a step following FIG. 7.

Next, as illustrated in FIG. 9, a side surface on the side 30AD of the board 30 abuts against the first upstanding section 43A and the second upstanding section 43B to confine the y-direction position of the board 30, and to control rotation on the xy plane of the board 30. Moreover, the x-direction position of the board 30 is confined by inserting the second upstanding section 43B into the notch 33B of the board 30.

Then, continuing with FIG. 9, the board 30 is rotated around the ends of the hook sections 41A and 41D as rotation axes A3 toward the main surface 30A in a downward direction indicated by an arrow A4. Therefore, as illustrated in FIG. 10, the corners 30A and 30D of the board 30 are hooked to the hook sections 41A and 41D, and the rear surfaces of the corners 30A and 30D of the board 30 abut against the base sections 42A and 42D, respectively, to perform positioning of the board 30 in the mounting region 40.

For information, in related art, a method of fixing a board to a bracket by sliding the board in a horizontal direction is performed. However, in the fixing method by sliding, a region where the board touches the bracket during sliding the board is an unmountable region; therefore, it is necessary to increase the size of the board accordingly, thereby causing an increase in cost. Moreover, there are issues that during sliding the board, the heat dissipation pad bonded to the rear surface of the board is displaced, and the chip mounted on the rear surface of the board is damaged and defective. Further, as it is necessary to have a clearance between the board and the bracket, chattering noise is generated.

On the other hand, in the embodiment, an unmountable region in the board 30 includes only regions contacting the hook sections 41A and 41D, the base sections 42A and 42D, and the bump sections 45B and 45C with the screw holes 44B and 44C, and an increase in the size of the board 30 is preventable. Moreover, as illustrated in FIG. 9, the board 30 is mounted by rotation; therefore, there is no possibility that the heat dissipation pad 50 on the rear surface of the board 30 is displaced, and the chip mounted on the rear surface of the board 30 is damaged and defective. Further, while the front surface of the board 30 is in contact with the hook sections 41A and 41D, the rear surface of the board 30 is in contact with the base sections 42A and 42D to allow the board 30 to be deflected, thereby reducing chattering noise.

Figure 10:
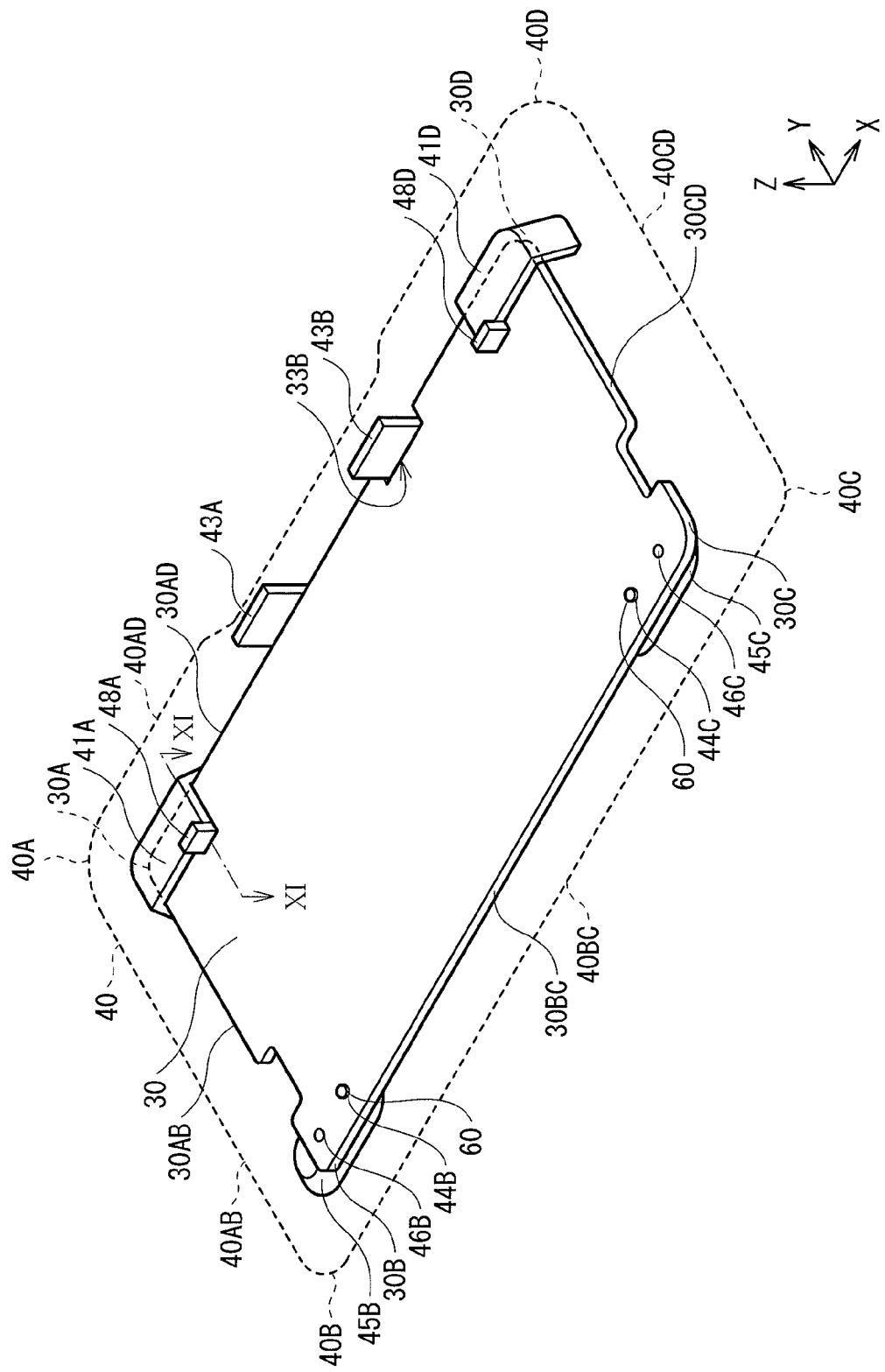
FIG. 10 is a perspective view illustrating a step following FIG. 9.
Figure 11:
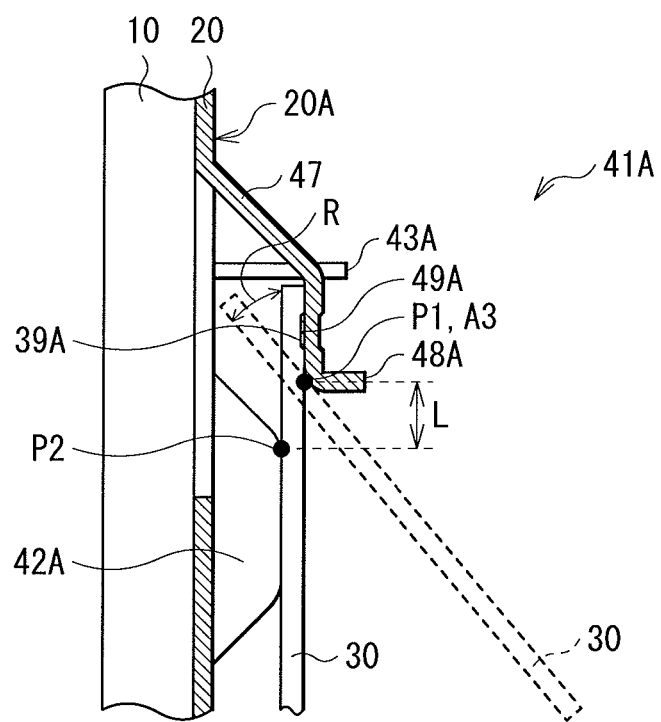
FIG. 11 is a sectional view taken along a line XI-XI of FIG. 10.

FIG. 11 illustrates a sectional configuration taken along a line XI-XI of FIG. 10. A distance L between an end P1 of the hook section 41A and an edge P2 of a surface, abutting against the rear surface of the corner 30A of the board 30, of the base section 42A preferably satisfies L>0 (mm). Therefore, the edge P2 of the base section 42A is prevented from interfering with a rotation locus R of the board 30 around the rotation axis A3 as a center. It is to be noted that the distance L is a distance between P1 and P2 in a direction perpendicular to the side 40AD with the hook sections 41A and 41D disposed thereon of the mounting region 40.

After that, the corners 30B and 30C of the board 30 are fixed to the board-mounting plate 20 with use of the screws 60 inserted into the screw holes 44B and 44C. Thus, mounting of the board 30 onto the mounting region 40 is completed.

Thus, in the embodiment, the hook sections 41A and 41D are disposed at the corners 40A and 40D of the mounting region 40, respectively, and the hook section 41A is fixed to the main surface 20A on two sides 40AB and 40AD of the corner 40A, and the hook section 41D is fixed to the main surface 20A on the sides 40AD and 40CD of the corner 40D. Therefore, the strength of the hook sections 41A and 41D is enhanced, and deformation of the hook sections 41A and 41D during transport or the like is allowed to be inhibited. Thus, an increase in cost caused by components damaged during transport is allowed to be inhibited.

Moreover, the corners 30A and 30D at both ends of the side 30AD of the board 30 are hooked to the hook sections 41A and 41D, respectively, and the board 30 is rotated around the ends of the hook sections 41A and 41D as the rotation axes A3 toward the main surface 20A; therefore, the board 30 is allowed to be easily positioned in the mounting region 40, thereby improving workability in board installation.

Further, during an operation until fixing the position of the board 30, the corners 30A and 30D at both ends of the side 30AD of the board 30 are allowed to be hooked to the hook sections 41A and 41D, respectively; thereby confining the position of the board 30. Therefore, a chip mounted on the rear surface of the board 30 is allowed to be prevented from being damaged and defective during positioning of the board 30.

In addition, two corners 30A and 30D of the board 30 are allowed to be fixed without screws, and the number of components and cost of components are allowed to be reduced. Further, cost reduction is achievable by reducing working time for tightening screws.

APPLICATION EXAMPLES

Application examples of the display described in the above-described embodiment will be described below. In addition to the television illustrated in FIG. 1, the display according to the above-described embodiment is applicable to displays of electronic units displaying a picture signal supplied from outside or a picture signal produced inside as an image or a picture in any fields, such as digital cameras, notebook personal computers, portable terminal devices such as cellular phones, game machines, and video cameras.

Application Example 1

Figure 12A:
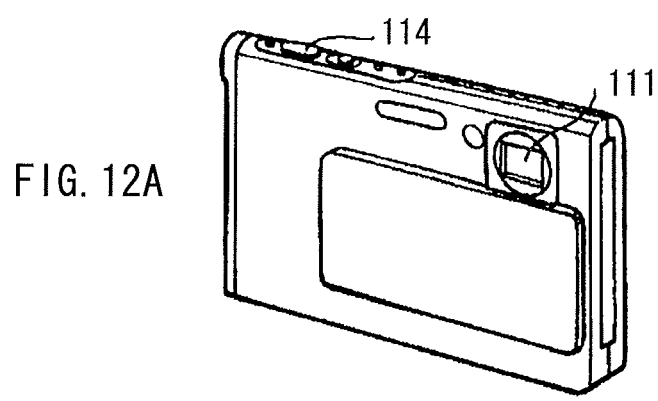
FIGS. 12A and 12B are perspective views illustrating an appearance of Application Example 1 when viewed from a front side and a back side thereof, respectively.
Figure 12B:
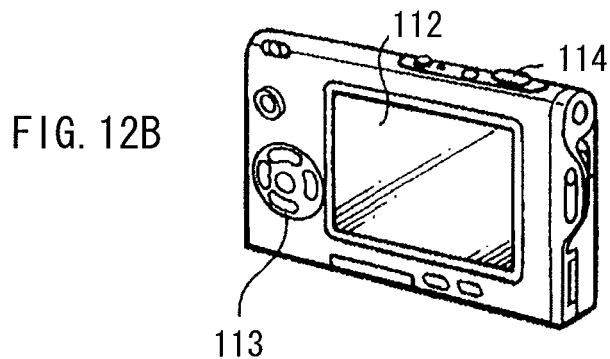

FIGS. 12A and 12B illustrate an appearance of a digital camera to which the display according to the above-described embodiment is applied. The digital camera has, for example, a light-emitting section for a flash 111, a display section 112, a menu switch 113, and a shutter button 114, and the display section 112 is configured of the display according to the above-described embodiment.

Application Example 2

Figure 13:
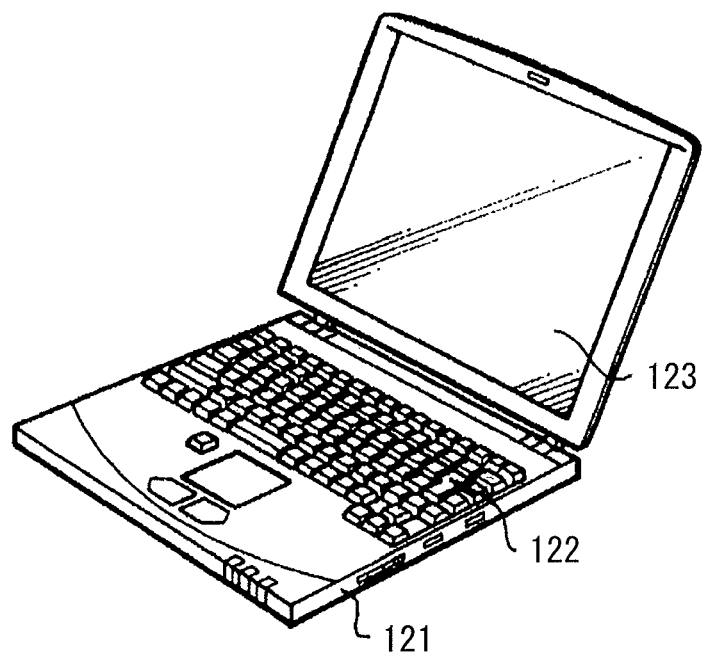
FIG. 13 is a perspective view illustrating an appearance of Application Example 2.

FIG. 13 illustrates an appearance of a notebook personal computer to which the display according to the above-described embodiment is applied. The notebook personal computer has, for example, a main body 121, a keyboard 122 for operation of inputting characters and the like, and a display section 123 for displaying an image, and the display section 123 is configured of the display according to the above-described embodiment.

Application Example 3

Figure 14:
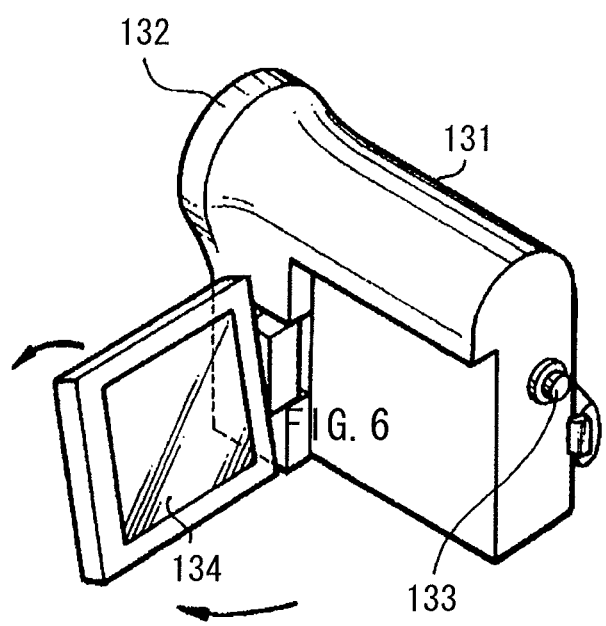
FIG. 14 is a perspective view illustrating an appearance of Application Example 3.

FIG. 14 illustrates an appearance of a video camera to which the display according to the above-described embodiment is applied. The video camera has, for example, a main body 131, a lens for shooting an object 132 arranged on a front surface of the main body 131, a shooting start/stop switch 133, and a display section 134, and the display section 134 is configured of the display according to the above-described embodiment.

Application Example 4

FIGS. 15A to 15G illustrate an appearance of a cellular phone to which the display according to the above-described embodiment is applied. The cellular phone is formed by connecting, for example, a top-side enclosure 141 and a bottom-side enclosure 142 to each other by a connection section (hinge section) 143, and the cellular phone has a display 144, a sub-display 145, a picture light 146, and a camera 147. The display 144 or the sub-display 145 is configured of the display according to the above-described embodiment.

Moreover, in the above-described Application Examples 1 to 4, electronic units including the display are described as examples; however, the technology is widely applicable to electronic units including a fixation mechanism for the board 30 such as printed circuit board. For example, in a DVD/BD/HDD recorder or recorder/player, the board-mounting plate according to the above-described embodiment is disposed on one surface of a main section performing recording or replay, and a board including a drive circuit is allowed to be mounted on the main section with use of the board-mounting plate. In such a case, the same functions and effects as those in the above-described embodiment are allowed to be obtained.

Although the present technology is described referring to the embodiment and the like, the technology is not limited thereto, and may be variously modified. For example, in the above-described embodiment, the case where the corners 30B and 30C of the board 30 are fixed to the board-mounting plate 20 with use of screws inserted into the screw holes 44B and 44C is described; however, the corners 30B and 30C of the board 30 may be fixed to the board-mounting plate 20 with use of a double-faced adhesive tape. Accordingly, the profile of the display and cost are allowed to be reduced.

Moreover, in the above-described embodiment, the case where the display section 10 includes a backlight unit (not illustrated) on the rear surface of the liquid crystal panel (not illustrated) is described as an example; however, the display section 10 may be any other display device such as an organic EL (Electroluminescence) display panel.

Further, in the above-described embodiment, the display including the display section 10, and the electronic unit including the display are described as examples; however, the technology is widely applicable to a fixation mechanism for the board 30 such as printed circuit board. Therefore, the technology is applicable to home appliances such as refrigerators, washing machines, vacuum cleaners, and cooking appliances, cosmetic appliances, and the like.

It is to be noted that the technology is allowed to have the following configurations.

(1) A display including:
a main section; and
a board-mounting plate disposed on one surface of the main section, and having a board-mounting region on a main surface on a side opposite to a side facing the main section,
in which the board-mounting plate includes, at corners at both ends of a side of the mounting region, hook sections allowing corners of a board to be hooked thereto, and the hook sections each are fixed to the main surface on two sides of the corner of the mounting region.

(2) The display according to (1), in which
the board-mounting plate includes a first upstanding section and a second upstanding section on a side with the hook sections disposed thereon of the mounting region, the first and second upstanding sections disposed orthogonal to the main surface, and abutting against a side surface of the board,
the second upstanding section is disposed in a position shifted from the first upstanding section in a direction toward a side opposite to the side with the hook sections disposed thereon of the mounting region, and
the board includes a notch allowing the second upstanding section to be inserted thereinto.

(3) The display according to (1) or (2), in which
a guide projection projected in a direction opposite to the main surface is disposed at an end of each of the hook sections.

(4) The display according to any one of (1) to (3), in which
the hook sections each include a projected section on a surface thereof facing the main surface, and the projected section abuts against a surface of the corner of the board.

(5) The display according to any one of (1) to (4), in which
the hook section is disposed on a long side of the mounting region.

(6) The display according to any one of (1) to (5), in which
the board-mounting plate is made of a metal, and
a heat dissipation pad is provided between the main surface of the board-mounting plate and a rear surface of the board.

(7) The display according to any one of (1) to (6), in which
the board-mounting plate includes a base section abutting against a rear surface of a corner section of the board in proximity to each of the hook sections.

(8) The display according to (7), in which
a distance L between an end of the hook section and an edge of a surface, abutting against the rear surface of a corner of the board, of the base section in a direction perpendicular to the side with the hook sections disposed thereon of the mounting region satisfies L>0 (mm).

(9) The display according to any one of (1) to (8), in which
the board-mounting plate has a screw hole for fixing a corner of the board to a side opposite to the side with the hook sections disposed thereon of the mounting region.

(10) An electronic unit including:
a main section; and
a board-mounting plate disposed on one surface of the main section, and having a board-mounting region on a main surface on a side opposite to a side facing the main section, in which the board-mounting plate includes, at corners at both ends of a side of the mounting region, hook sections allowing corners of a board to be hooked thereto, and the hook sections each are fixed to the main surface on two sides of the corner of the mounting region.

It should be understood by those skilled in the art that various modifications, combinations, sub-combinations, and alterations may occur depending on design requirements and other factors insofar as they are within the scope of the appended claims or the equivalents thereof.

What is claimed is:

1. A display comprising:
a main section; and
a board-mounting plate disposed on one surface of the main section, and having a board-mounting region on a main surface on a side opposite to a side facing the main section,
wherein the board-mounting plate includes, at corners at both ends of a side of the mounting region, hook sections allowing corners of a board to be hooked thereto, and the hook sections each are fixed to the main surface on two sides of the corner of the mounting region.

2. The display according to claim 1, wherein
the board-mounting plate includes a first upstanding section and a second upstanding section on a side with the hook sections disposed thereon of the mounting region, the first and second upstanding sections disposed orthogonal to the main surface, and abutting against a side surface of the board,
the second upstanding section is disposed in a position shifted from the first upstanding section in a direction toward a side opposite to the side with the hook sections disposed thereon of the mounting region, and
the board includes a notch allowing the second upstanding section to be inserted thereinto.

3. The display according to claim 1, wherein
a guide projection projected in a direction opposite to the main surface is disposed at an end of each of the hook sections.

4. The display according to claim 1, wherein
the hook sections each include a projected section on a surface thereof facing the main surface, and the projected section abuts against a surface of the corner of the board.

5. The display according to claim 1, wherein
the hook section is disposed on a long side of the mounting region.

6. The display according to claim 1, wherein
the board-mounting plate is made of a metal, and
a heat dissipation pad is provided between the main surface of the board-mounting plate and a rear surface of the board.

7. The display according to claim 1, wherein
the board-mounting plate includes a base section abutting against a rear surface of a corner section of the board in proximity to each of the hook sections.

8. The display according to claim 7, wherein
a distance L between an end of the hook section and an edge of a surface, abutting against the rear surface of a corner of the board, of the base section in a direction perpendicular to the side with the hook sections disposed thereon of the mounting region satisfies L>0 (mm).

9. The display according to claim 1, wherein
the board-mounting plate has a screw hole for fixing a corner of the board to a side opposite to the side with the hook sections disposed thereon of the mounting region.

* * * * *